United States Patent
Lin

(10) Patent No.: US 10,128,824 B2
(45) Date of Patent: Nov. 13, 2018

(54) COMMON-MODE CLAMPING CIRCUIT AND METHOD THEREOF

(71) Applicant: Realtek Semiconductor Corp., Hsinchu (TW)

(72) Inventor: Chia-Liang (Leon) Lin, Fremont, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 94 days.

(21) Appl. No.: 15/343,247

(22) Filed: Nov. 4, 2016

(65) Prior Publication Data

US 2018/0131353 A1 May 10, 2018

(51) Int. Cl.
*H03K 5/08* (2006.01)
(52) U.S. Cl.
CPC ........................................ *H03K 5/08* (2013.01)
(58) Field of Classification Search
CPC .......................................................... H03K 5/08

USPC ........................................................... 327/328
See application file for complete search history.

(56) References Cited

U.S. PATENT DOCUMENTS

2015/0303907 A1  10/2015  Pan et al.

*Primary Examiner* — Lincoln Donovan
*Assistant Examiner* — Metasebia Retebo
(74) *Attorney, Agent, or Firm* — McClure, Qualey & Rodack, LLP

(57) ABSTRACT

An apparatus includes a first AC (alternating current) coupling circuit configured to receive a first end of a differential signal and output a first coupled signal in accordance with a bias voltage; a second AC coupling circuit configured to receive a second end of the differential signal and output a second coupled signal in accordance with the bias voltage; a first complementary joint-control cascode pair configured to shunt the first end of the differential signal to a DC (direct current) node in accordance with a joint control by the first coupled signal and the second coupled signal; and a second complementary joint-control cascode pair configured to shunt the second end of the differential signal to the DC node in accordance with a joint control by the first coupled signal and the second coupled signal. A related method is also provided.

20 Claims, 5 Drawing Sheets

COMMON-MODE CLAMPING CIRCUIT AND METHOD THEREOF

BACKGROUND OF THE INVENTION

Field of the Invention

The present invention generally relates to common-mode clamping circuits, and more particularly to circuits and methods that utilize cascode circuits in common-mode clamping.

Description of Related Art

Differential signaling is widely used in many applications. A differential signal comprises a first end and a second end, wherein a value of the differential signal is equal to a difference between a value of the first end and a value of the second end. A mean value between the first end and the second end is referred to as a value of a common-mode signal associated with the differential signal. In a differential circuit, the differential signal is what is of interest. On the other hand, the common-mode signal carries no useful information but uses a part of a dynamic range of the differential circuit. Therefore, the common-mode signal is typically undesirable and generally should be suppressed. A common-mode clamp is a circuit that is configured to suppress (or clamp) a common-mode signal of a differential circuit. A common-mode clamp usually needs to sense a value of the common-mode signal, and then perform the suppression based on the sensed value.

It is desired to provide improved clamping circuits for common mode signaling systems.

BRIEF SUMMARY OF THIS INVENTION

What is disclosed is a method for clamping a common-mode signal without needing a circuit to sense the common-mode signal In an embodiment, an apparatus includes: a first AC (alternating current) coupling circuit configured to receive a first end of a differential signal and output a first coupled signal in accordance with a bias voltage; a second AC coupling circuit configured to receive a second end of the differential signal and output a second coupled signal in accordance with the bias voltage; a first complementary joint-control cascode pair configured to shunt the first end of the differential signal to a DC (direct current) node in accordance with a joint control by the first coupled signal and the second coupled signal; and a second complementary joint-control cascode pair configured to shunt the second end of the differential signal to the DC node in accordance with a joint control by the first coupled signal and the second coupled signal. In an embodiment, the first complementary joint-control cascode pair includes a parallel connection of a first cascode circuit and a second cascode circuit, and the second complementary joint-control cascode pair includes a parallel connection of a third cascode circuit and a fourth cascode circuit. In an embodiment, each of the first, the second, the third, and the fourth cascode circuit includes a source pin connected to the DC node, a drain pin connected to one of the first and the second end of the differential signal, a first gate pin connected to one of the first and the second coupled signal, and a second gate pin connected to the other one of the first and the second AC coupled signal. In an embodiment, each of the first, the second, the third, and the fourth cascode circuit includes two MOS (metal oxide semiconductor) transistors of the same type, in which a first one of the two MOS transistors includes a source, a gate, and a drain terminal connected to the source pin, the first gate pin, and an internal node, respectively, while a second one of the two MOS transistors includes a source, a gate, and a drain terminal connected to the internal node, the second gate pin, and the drain pin, respectively.

In an embodiment, a method includes: receiving a first end and a second end of a differential signal; coupling the first end of the differential signal into a first coupled signal in accordance with a bias voltage; coupling the second end of the differential signal into a second coupled signal in accordance with the bias voltage; shunting the first end of the differential signal to a DC node using a first complementary joint-control cascode pair in accordance with a joint control by the first coupled signal and the second coupled signal; and shunting the second end of the differential signal to the DC node using a second complementary joint-control cascode pair in accordance with a joint control by the first coupled signal and the second coupled signal. In an embodiment, the first complementary joint-control cascode pair includes a parallel connection of a first cascode circuit and a second cascode circuit, and the second complementary joint-control cascode pair includes a parallel connection of a third cascode circuit and a fourth cascode circuit. In an embodiment, each of the first, the second, the third, and the fourth cascode circuit includes a source pin connected to the DC node, a drain pin connected to one of the first and the second end of the differential signal, a first gate pin connected to one of the first and the second coupled signal, and a second gate pin connected to the other one of the first and the second AC coupled signal. In an embodiment, each of the first, the second, the third, and the fourth cascode circuit includes two MOS (metal oxide semiconductor) transistors of the same type, in which a first one of the two MOS transistors comprises a source, a gate, and a drain terminal connected to the source pin, the first gate pin, and an internal node, respectively, while a second one of the two MOS transistors comprises a source, a gate, and a drain terminal connected to the internal node, the second gate pin, and the drain pin, respectively.

DETAILED DESCRIPTION OF THIS INVENTION

Figure 1:
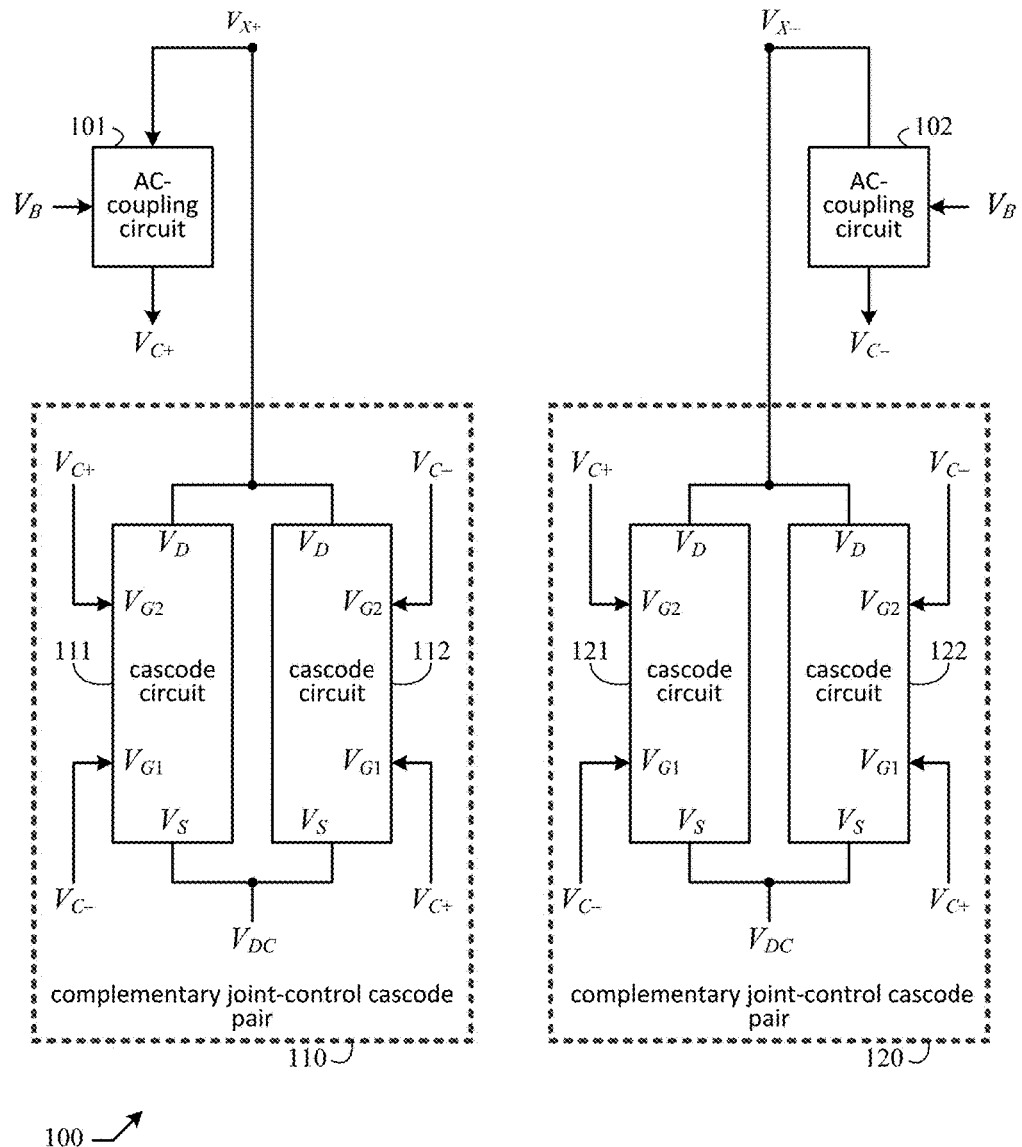
FIG. 1 shows a schematic diagram of a common-mode clamping circuit in accordance with an embodiment of the present invention.

The present invention relates to common-mode clamping circuits. While the specification describes several example embodiments of the invention considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the invention.

Persons of ordinary skill in the art will understand terms and basic concepts related to microelectronics that are used in this disclosure, such as "voltage," "signal," "differential signal," "common mode," "capacitor," "resistor," "transistor," "MOS (metal-oxide semiconductor)," "PMOS (p-channel metal oxide semiconductor)," "NMOS (n-channel metal oxide semiconductor)," "AC (alternating current)," "AC couple," "DC (direct current)," "source," "gate," "drain," "node," "ground node," "power node," "parallel connection," and "cascode." Terms and basic concepts like these are apparent to those of ordinary skill in the art and thus will not be explained in detail here.

Throughout this disclosure, "DC" stands for direct current, "AC" stands for alternating current, and "CM" stands for common-mode. A DC node is a node of a substantially fixed electric potential. In particular, "$V_{DD}$" denotes a first DC node referred to as a power node, and "$V_{SS}$" denotes a second DC node referred to as a ground node. Besides, "$V_{DC}$" denotes a DC node that refers to either the power node "$V_{DD}$" or the ground node "$V_{SS}$," depending on the context.

Throughout this disclosure, a signal refers to a voltage that can vary dynamically. A differential signal consists of a pair of companion signals, with a first denoted by attaching a plus sign "+" in subscript and a second denoted by attaching a minus sign "−" in subscript. A common-mode level of the differential signal is denoted by attaching an acronym "CM" in subscript and is defined as a mean value of the first part end the second end. Throughout this disclosure, the differential signal of interest is denoted as "$V_X$," which consists of a first end "$V_{X+}$" and a second end "$V_{X-}$"; the common-mode level of $V_X$, denoted as $V_{XCM}$, is defined by:

$$V_{XCM} \equiv (V_{X+} + V_{X-})/2. \quad (1)$$

In this disclosure, a common-mode clamping circuit configured to clamp $V_{XCM}$ (the common-mode level of $V_X$, the differential signal of interest) is disclosed. The common-mode clamping circuit can be used to withstand a large disturbance on $V_{XCM}$ due to, for instance, an undesired electromagnetic interference. There are two versions of the common-mode clamping circuit. A first version, referred to as a low-side embodiment, is configured to withstand a large disturbance that causes $V_{XCM}$ to rise sharply. A second version, referred to as a high-side embodiment, is configured to withstand a large disturbance that causes $V_{XCM}$ to fall sharply. Using a combination of both versions can provide a complete protection against a large disturbance that can cause $V_{XCM}$ to change sharply in either way.

FIG. 1 shows a schematic diagram of a common-mode clamping circuit 100 in accordance with an embodiment of the present invention. The common-mode clamping circuit 100 comprises a first AC coupling circuit 101 configured to couple $V_{X+}$ into a first coupled signal $V_{C+}$ in accordance with a bias voltage $V_B$; a second AC coupling circuit 102 configured to couple $V_{X-}$ into a second coupled signal $V_{C-}$ in accordance with the bias voltage $V_B$; a first complementary joint-control cascode pair 110 configured to shunt $V_{X+}$ to $V_{DC}$ in accordance with a joint control by $V_{C+}$ and $V_{C-}$; and a second complementary joint-control cascode pair 120 configured to shunt $V_{X-}$ to $V_{DC}$ in accordance with a joint control by $V_{C+}$ and $V_{C-}$. The first complementary joint-control cascode pair 110 comprises a parallel connection of two cascode circuits 111 and 112, while the second complementary joint-control cascode pair 120 comprises a parallel connection of another two cascode circuits 121 and 122. Each of the four cascode circuits (111, 112, 121, and 122) has four pins including a source pin labeled by "$V_S$," a drain pin labeled by "$V_D$," a first gate pin labeled by "$V_{G1}$," and a second gate pin labeled by "$V_{G2}$."

For cascode circuit 111 (112), the source pin "$V_S$" connects to $V_{DC}$, the drain pin "$V_D$" connects to $V_{X+}$, the first gate pin "$V_{G1}$" connects to $V_{C-}$ ($V_{C+}$), and the second gate pin "$V_{G2}$" connects to $V_{C+}$ ($V_{C-}$). For cascode circuit 121 (122), the source pin "$V_S$" connects to $V_{DC}$, the drain pin "$V_D$" connects to $V_{X-}$, the first gate pin "$V_{G1}$" connects $V_{C-}$ ($V_{C+}$), and the second gate pin "$V_{G2}$" connects to $V_{C+}$ ($V_{C-}$). The term "joint-control", for each of the four cascode circuits, means one of the first gate pin "$V_{G1}$" and the second gate pin "$V_{G2}$" connects to $V_{C+}$, which is coupled from $V_{X+}$, while the other connects to $V_{C-}$, which is coupled from $V_{X-}$. For cascode circuits 111 (121), the first gate pin "$V_{G1}$" connects to $V_{C-}$ and the second gate pin "$V_{G2}$" connects to $V_{C+}$. For cascode circuit 112 (122), the first gate pin "$V_{G1}$" connects to $V_{C+}$ and the second gate pin "$V_{G2}$" connects to $V_{C-}$. Therefore, cascode circuits 111 (121) and 112 (122) are configured in joint-control topology but differ in a complementary manner.

The common-mode clamping circuit 100 of FIG. 1 can be embodied either in a low-side embodiment or a high-side embodiment. In the low-side embodiment, $V_{DC}$ refers to $V_{SS}$, and all the four cascode circuits (111, 112, 121, 122) are constructed by using NMOS transistors. In the high-side embodiment, $V_{DC}$ refers to $V_{DD}$, and all the four cascode circuits (111, 112, 121, 122) are constructed by using PMOS transistors.

Figure 2:
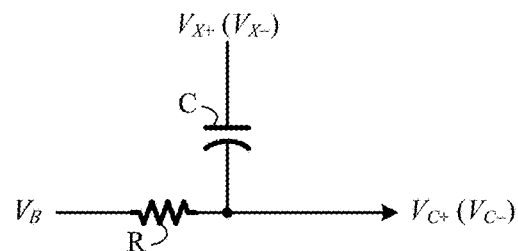
FIG. 2 shows a schematic diagram of an AC coupling circuit.

A schematic diagram of an AC coupling circuit 200 suitable for embodying the first (second) AC coupling circuit 101 (102) of FIG. 1 is depicted in FIG. 2. The AC coupling circuit 200 comprises: a capacitor C configured to couple $V_{X+}$ ($V_{X-}$) to $V_{C+}$ ($V_{C-}$); and a resistor R configured to couple $V_B$ to $V_{C+}$ ($V_{C-}$). In a static scenario wherein $V_{X+}$ ($V_{X-}$) is stationary, $V_{C+}$ ($V_{C-}$) is stationary and equal to $V_B$. In a dynamic scenario wherein $V_{X+}$ ($V_{X-}$) is varying, $V_{C+}$ ($V_{C-}$) follows $V_{X+}$ ($V_{X-}$) and varies accordingly.

Figure 3A:
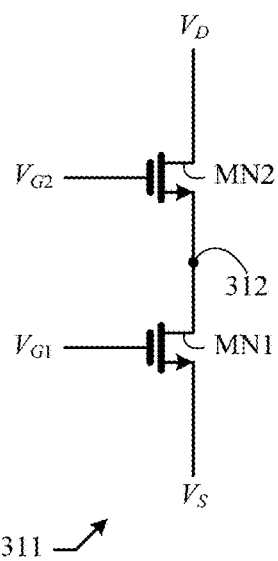
FIG. 3A shows a schematic of a cascode circuit in a low-side embodiment.

A schematic diagram of a cascode circuit 311 suitable for embodying the four cascode circuits (111, 112, 121, and 122) of the common-mode clamping circuit 100 of FIG. 1 in a low-side embodiment is depicted in FIG. 3A. Cascode circuit 311 comprises a first NMOS transistor MN1 and a second NMOS transistor MN2. The source, the gate, and the drain terminal of the first NMOS transistor MN1 connect to "$V_S$," "$V_{G1}$," and an internal node 312, respectively. The source, the gate, and the drain terminal of the second NMOS transistor MN2 connect to the internal node 312, "$V_{G2}$," and "$V_D$," respectively. The cascode circuit 311 can be in a high-conduction state only when both of the voltage at "$V_{G1}$" and the voltage at "$V_{G2}$" are sufficiently high; otherwise, the cascode circuit 311 is in a low-conduction state.

Figure 3B:
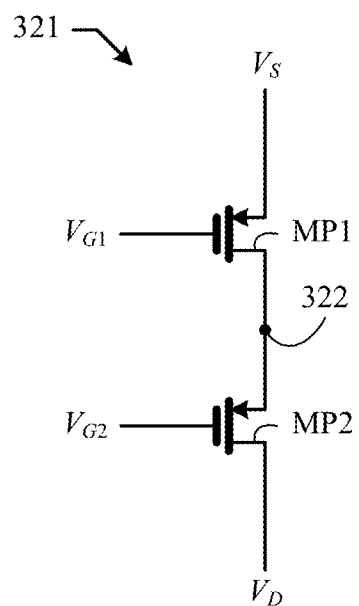
FIG. 3B shows a schematic of a cascode circuit in a high-side embodiment.

A schematic diagram of a cascode circuit 321 suitable for embodying the four cascode circuits (111, 112, 121, and 122) of the common-mode clamping circuit 100 of FIG. 1 in a high-side embodiment is depicted in FIG. 3B. Cascode circuit 321 comprises a first PMOS transistor MP1 and a second PMOS transistor MP2. The source, the gate, and the drain terminal of the first PMOS transistor MP1 connect to "$V_S$," "$V_{G1}$," and an internal node 322, respectively. The source, the gate, and the drain terminal of the second PMOS transistor MP2 connect to the internal node 322, "$V_{G2}$," and "$V_D$," respectively. The cascode circuit 321 can be in a high-conduction state only when both of the voltage at "$V_G$," and the voltage at "$V_{G2}$" are sufficiently low; otherwise, the cascode circuit 321 is in a low-conduction state.

Now referring back to FIG. 1. In a static scenario, both $V_{C+}$ and $V_{C-}$ are equal to $V_B$ thanks to AC coupling circuits 101 and 102. In a low-side (high-side) embodiment, the bias voltage $V_B$ is set so that, in the static scenario, both $V_{C+}$ and $V_{C-}$ are too low (high) for any of the four cascode circuits (111, 112, 121, and 122) to be in a high-conduction state. Each of the four cascode circuits (111, 112, 121, and 122) is constructed using two NMOS (PMOS) transistors, wherein one has a gate terminal controlled by one of $V_{C+}$ and $V_{C-}$ via terminal "$V_{G1}$" and the other has a gate terminal controlled by the other one of $V_{C+}$ and $V_{C-}$ via terminal "$V_{G2}$." By way of example but not limitation, the two NMOS (PMOS) transistors have the same threshold voltage and the bias voltage $V_B$ is established so that a difference between $V_B$ and $V_{DC}$ is approximately equal to the threshold voltage; this will cause the four cascode circuits (111, 112, 121, and 122) to be in a low-conduction state in the static scenario. Due to the joint-control topology, the four cascode circuits all remain in the low-conduction state unless both $V_{C+}$ and $V_{C-}$ rise (fall) sharply in a dynamic scenario in response to a CM disturbance that causes both $V_{X+}$ and $V_{X-}$ to rise (fall) sharply; when that occurs, all the four cascode circuits enter into a high-conduction state to pull both $V_{X+}$ and $V_{X-}$ down (up) towards $V_{SS}$ ($V_{DD}$), thus defying the CM disturbance that causes both $V_{X+}$ and $V_{X-}$ to rise(fall) sharply.

By way of example but not limitation: the resistor R is 200 KOhm, and the capacitor C is 5 pF in FIG. 2; the width/length is 100 μm/250 nm and the threshold voltage is 600 mV for the two NMOS transistors MN1 and MN2 in FIG. 3A; the width/length is 200 μm/250 nm and the threshold voltage is 600 mV for the two PMOS transistors MP1 and MP2 in FIG. 3B $V_{DC}$ is 0V and $V_B$ is 600 mV in FIG. 1 for a low-side embodiment; and $V_{DC}$ is 2.5V and $V_B$ is 1.9V in FIG. 1 for a high-side embodiment. Using these parameters, the four cascode circuits (411, 412, 421, and 422) are all in a low-conduction state in the static scenario.

Figure 4:
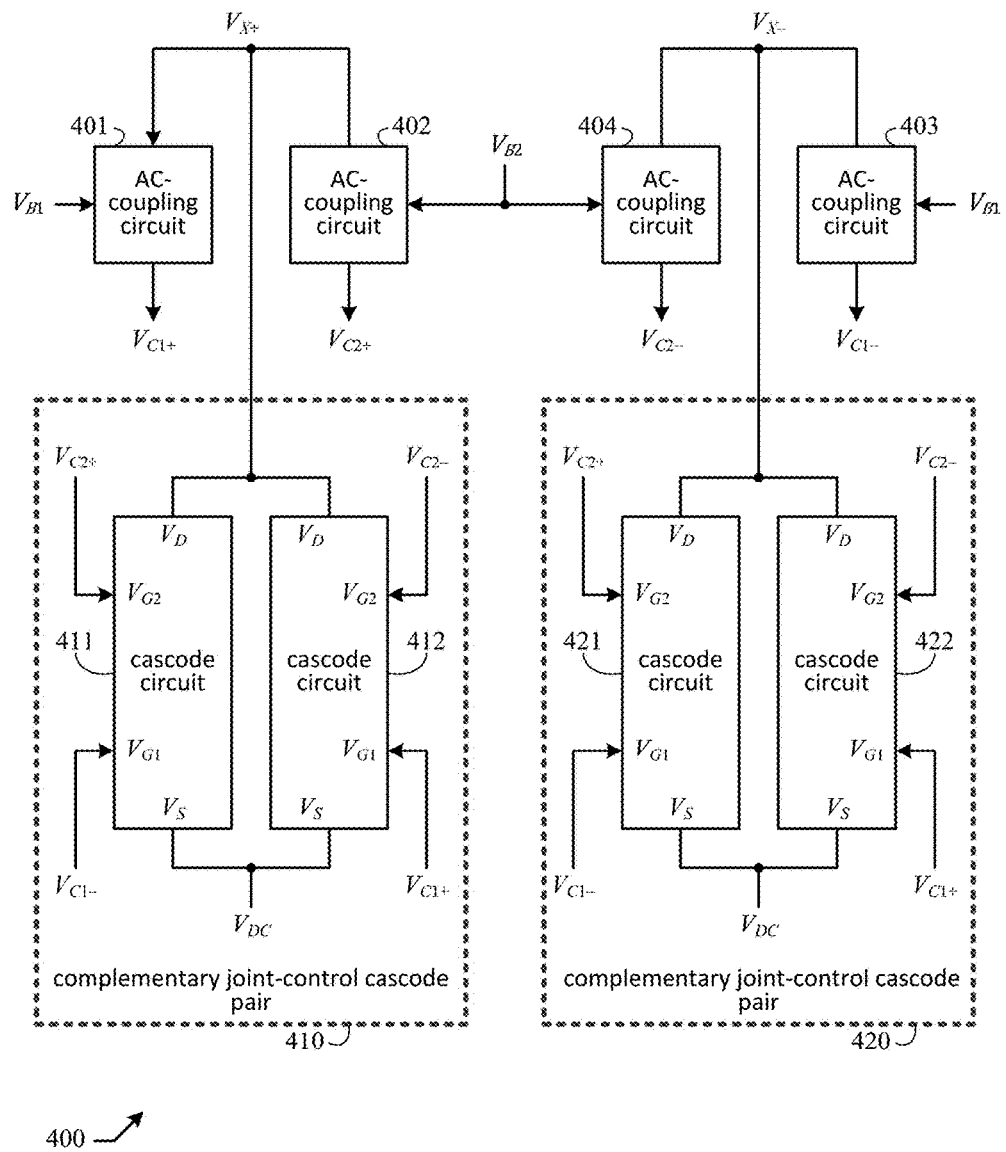
FIG. 4 shows a schematic diagram of a common-mode clamping circuit in accordance with an alternative embodiment of the present invention.

FIG. 4 shows a schematic diagram of a common-mode clamping circuit 400 in accordance with an alternative embodiment of the present invention. The common-mode clamping circuit 400 comprises a first AC coupling circuit 401 configured to couple $V_{X+}$ into a first coupled signal $V_{C1+}$ in accordance with a first bias voltage $V_{B1}$; a second AC coupling circuit 402 configured to couple $V_{X+}$ into a second coupled signal $V_{C2+}$ in accordance with a second bias voltage $V_{B2}$; a third AC coupling circuit 403 configured to couple $V_{X-}$ into a third coupled signal $V_{C1-}$ in accordance with the first bias voltage $V_{B1}$; a fourth AC coupling circuit 404 configured to couple $V_{X-}$ into a fourth coupled signal $V_{C2-}$ in accordance with the second bias voltage $V_{B2}$; a first complementary joint-control cascode pair 410 configured to shunt $V_{X+}$ to $V_{DC}$ in accordance with a joint control by $V_{C1+}$, $V_{C2+}$, $V_{C1-}$ and $V_{C2-}$; and a second complementary joint-control cascode pair 420 configured to shunt $V_{X-}$ to $V_{DC}$ in accordance with a joint control by $V_{C1+}$, $V_{C2+}$, $V_{C1-}$ and $V_{C2-}$. The first complementary joint-control cascode pair 410 comprises a parallel connection of two cascode circuits 411 and 412, while the second complementary joint-control cascode pair 420 comprises a parallel connection of another two cascode circuits 421 and 422. Each of the four cascode circuits (411, 412, 421, and 422) has four pins including a source pin labeled by "$V_S$," a drain pin labeled by "$V_D$," a first gate pin labeled by "$V_{G1}$," and a second gate pin labeled by "$V_{G2}$." For cascode circuit 411 (412), the source pin "$V_S$" connects to $V_{DC}$, the drain pin "$V_D$" connects to $V_{X+}$, the first gate pin "$V_{G1}$" connects $V_{C1-}$ ($V_{C1+}$), and the second gate pin "$V_{G2}$" connects $V_{C2+}$ ($V_{C2-}$). For cascode circuit 421 (422), the source pin "$V_S$" connects to $V_{DC}$, the drain pin "$V_D$" connects to $V_{X-}$, the first gate pin "$V_{G1}$" connects $V_{C1-}$ ($V_{C1+}$), and the second gate pin "$V_{G2}$" connects $V_{C2+}$ ($V_{C2-}$). The term "joint-control" refers to that, for each of the four cascode circuits, one of the first gate pin "$V_{G1}$" and the second gate pin "$V_{G2}$" connects to a signal coupled from $V_{X+}$, while the other connects to a signal coupled from $V_{X-}$.

For cascode circuits 411 (421), the first gate pin "$V_{G1}$" connects to $V_{C1-}$, which is coupled from $V_{X-}$, while the second gate pin "$V_{G2}$" connects to $V_{C2+}$, which is coupled from $V_{X+}$. For cascode circuit 412 (422), the first gate pin "$V_{G1}$" connects to $V_{C1+}$, which is coupled from $V_{X+}$, while the second gate pin "$V_{G2}$" connects to $V_{C2-}$, which is coupled from $V_{X-}$. Therefore, cascode circuits 411 (421) and 412 (422) are configured in joint-control topology but differ in a complementary manner. The four AC coupling circuits (401, 402, 403, and 404) can be embodied using the AC coupling circuit 200 of FIG. 2 (with proper changes of signal names, e.g. replacing "$V_B$" with "$V_{B1}$" or "$V_{B2}$," replacing "$V_{C+}$" with "$V_{C1+}$" or "$V_{C2+}$," and replacing "$V_{C-}$" with "$V_{C1-}$" or "$V_{C2-}$"). The four cascode circuits (411, 412, 421, and 422) can be embodied using the cascode circuit 311 of FIG. 3A in a low-side embodiment, or embodied using the cascode circuit 321 of FIG. 3B in a high-side embodiment. The common-mode clamping circuit 400 of FIG. 4 offers an advantage over the common-mode circuit 100 of FIG. 1 in that, the bias voltage at the first gate pin "$V_{G1}$" can be set differently from the bias voltage at the second gate pin "$V_{G2}$" for the four cascode circuits (411, 412, 421, and 422) due to using two separate bias voltages $V_{B1}$ and $V_{B2}$, and therefore a higher degree of freedom is available for optimizing the performance. However, this advantage comes at a cost of higher complexity. By way of example but not limitation: the threshold voltage is 600 mV for all transistors; $V_{DC}$ is 0V, $V_{B1}$ is 600 mV, and $V_{B2}$ is 700 mV for a low-side embodiment; $V_{DC}$ is 2.5V, $V_{B1}$ is 1.9V, and $V_{B2}$ is 1.8V for a high-side embodiment. Using these parameters, the four cascode circuits (411, 412, 421, and 422) are still in a low-conduction state in the static scenario, but reacts faster in the dynamic scenario thanks to that the transistor controlled by $V_{B2}$ is biased deeper into the conduction state.

Figure 5:
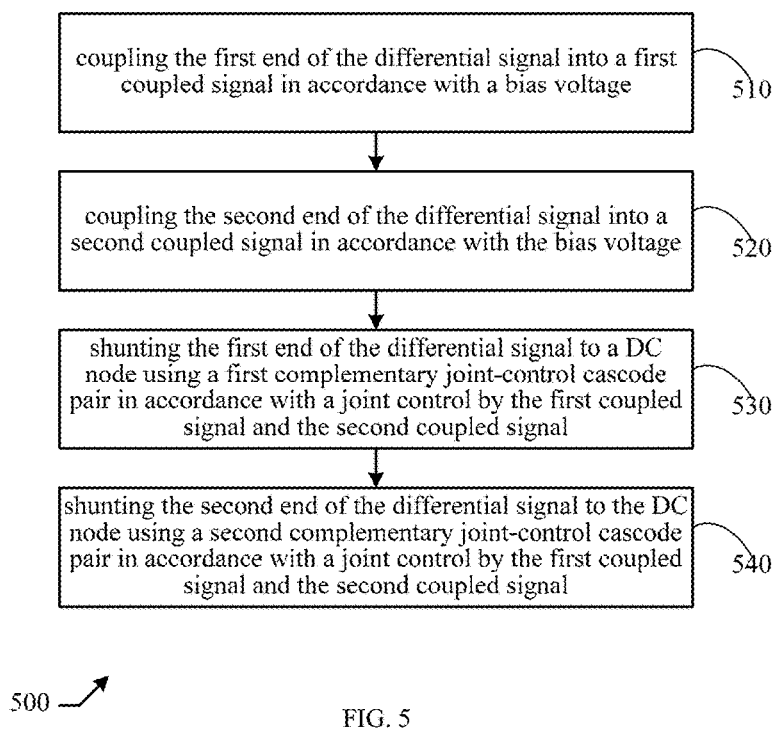
FIG. 5 shows a flow diagram of a method in accordance with the present invention.

A flow diagram 500 of a method in accordance with an embodiment of the present invention is depicted in FIG. 5. The method comprises: (step 510) receiving a first end and a second end of a differential signal; (step 520) coupling the first end of the differential signal into a first coupled signal in accordance with a bias voltage; (step 530) coupling the second end of the differential signal into a second coupled signal in accordance with the bias voltage; (step 540) shunting the first end of the differential signal to a DC node using a first complementary joint-control cascode pair in accordance with a joint control by the first coupled signal and the second coupled signal; and (step 550) shunting the second end of the differential signal to the DC node using a second complementary joint-control cascode pair in accordance with a joint control by the first coupled signal and the second coupled signal.

Persons skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A circuit comprising:
a first AC (alternating current) coupling circuit configured to receive a first end of a differential signal and output a first coupled signal in accordance with a bias voltage;
a second AC coupling circuit configured to receive a second end of the differential signal and output a second coupled signal in accordance with the bias voltage;
a first complementary joint-control cascode pair configured to shunt the first end of the differential signal to a DC (direct current) node in accordance with a joint control by the first coupled signal and the second coupled signal; and
a second complementary joint-control cascode pair configured to shunt the second end of the differential signal to the DC node in accordance with a joint control by the first coupled signal and the second coupled signal.

2. The apparatus of claim 1, wherein the first complementary joint-control cascode pair comprises a parallel connection of a first cascode circuit and a second cascode circuit, and the second complementary joint-control cascode pair comprises a parallel connection of a third cascode circuit and a fourth cascode circuit.

3. The apparatus of claim 2, wherein each of the first, the second, the third, and the fourth cascode circuit comprises a source pin connected to the DC node, a drain pin connected to one of the first and the second end of the differential signal, a first gate pin connected to one of the first and the second coupled signal, and a second gate pin connected to the other one of the first and the second AC coupled signal.

4. The apparatus of claim 3, wherein each of the first, the second, the third, and the fourth cascode circuit comprises two MOS (metal oxide semiconductor) transistors of the same type, wherein: a first one of the two MOS transistors comprises a source, a gate, and a drain terminal connected to the source pin, the first gate pin, and an internal node, respectively, while a second one of the two MOS transistors comprises a source, a gate, and a drain terminal connected to the internal node, the second gate pin, and the drain pin, respectively.

5. The apparatus of claim 4, wherein the two MOS transistors are NMOS (n-channel metal oxide semiconductor) transistors.

6. The apparatus of claim 5, wherein the DC node is a ground node.

7. The apparatus of claim 6, wherein the bias voltage is set so that in a static scenario the two NMOS transistors are in a low-conduction state.

8. The apparatus of claim 4, wherein the two MOS transistors are PMOS (p-channel metal oxide semiconductor) transistors.

9. The apparatus of claim 8, wherein the DC node is a power node.

10. The apparatus of claim 9, wherein the bias voltage is set so that in a static scenario the two PMOS transistors are in a low-conduction state.

11. A method comprising:
receiving a first end and a second end of a differential signal;
coupling the first end of the differential signal into a first coupled signal in accordance with a bias voltage;
coupling the second end of the differential signal into a second coupled signal in accordance with the bias voltage;
shunting the first end of the differential signal to a DC node using a first complementary joint-control cascode pair in accordance with a joint control by the first coupled signal and the second coupled signal; and
shunting the second end of the differential signal to the DC node using a second complementary joint-control cascode pair in accordance with a joint control by the first coupled signal and the second coupled signal.

12. The method of claim 11, wherein the first complementary joint-control cascode pair comprises a parallel connection of a first cascode circuit and a second cascode circuit, and the second complementary joint-control cascode pair comprises a parallel connection of a third cascode circuit and a fourth cascode circuit.

13. The method of claim 12, wherein each of the first, the second, the third, and the fourth cascode circuit comprises a source pin connected to the DC node, a drain pin connected to one of the first and the second end of the differential signal, a first gate pin connected to one of the first and the second coupled signal, and a second gate pin connected to the other one of the first and the second AC coupled signal.

14. The method of claim 13, wherein each of the first, the second, the third, and the fourth cascode circuit comprises two MOS (metal oxide semiconductor) transistors of the same type, wherein: a first one of the two MOS transistors comprises a source, a gate, and a drain terminal connected to the source pin, the first gate pin, and an internal node, respectively, while a second one of the two MOS transistors comprises a source, a gate, and a drain terminal connected to the internal node, the second gate pin, and the drain pin, respectively.

15. The method of claim 14, wherein the two MOS transistors are NMOS (n-channel metal oxide semiconductor) transistors.

16. The method of claim 15, wherein the DC node is a ground node.

17. The method of claim 16, wherein the bias voltage is set so that in a static scenario the two NMOS transistors are in a low-conduction state.

18. The method of claim 14, wherein the two MOS transistors are PMOS (p-channel metal oxide semiconductor) transistors.

19. The method of claim 18, wherein the DC node is a power node.

20. The method of claim 19, wherein the bias voltage is set so that in a static scenario the two PMOS transistors are in a low-conduction state.

* * * * *